United States Patent [19]
Hwu et al.

[11] Patent Number: 5,396,658
[45] Date of Patent: Mar. 7, 1995

[54] RADIO FREQUENCY ANTENNA AND MIXER ARRAY

[75] Inventors: R. Jennifer Hwu, Salt Lake City; J. Mark Baird, Sandy; Roberto W. Alm, Salt Lake City, all of Utah

[73] Assignee: University of Utah Research Foundation, Salt Lake City, Utah

[21] Appl. No.: 76,381

[22] Filed: Jun. 14, 1993

[51] Int. Cl.⁶ ............................................. H04B 1/28
[52] U.S. Cl. ................................. 455/327; 455/314; 455/326; 343/795; 343/700 MS File
[58] Field of Search ............... 455/272, 313, 314, 323, 455/326–329; 343/795, 700 MS File

[56] References Cited

U.S. PATENT DOCUMENTS 4,607,394  8/1986  Nightingale .................... 455/327
4,980,925  12/1990  Blustine et al. .................... 455/327

*Primary Examiner*—Edward F. Urban
*Assistant Examiner*—Mary M. Lin
*Attorney, Agent, or Firm*—Thorpe North & Western

[57] ABSTRACT

A radio frequency millimeter-wave signal antenna and mixer system includes a dielectric substrate having a generally planar upper surface, and a ground-plane layer of conductive material disposed below the upper surface. This ground plane layer includes a plurality of spaced-apart low conductivity sections or windows to allow passage therethrough of radio frequency signals received at a surface of the substrate. A plurality of antennae are disposed on the upper surface of the substrate, with each antenna being positioned over a respective one of the windows in the ground-plane layer. A plurality of mixers are also disposed on the upper surface of the substrate, each adjacent a respective antenna for receiving radio frequency signals therefrom and for producing intermediate frequency signals. A plurality of output conductors are formed on the upper surface of the substrate, each being coupled to a respective mixer to extend therefrom alongside the antenna from which respective mixer receives radio frequency signals. The output conductors carry intermediate frequency signals from the respective mixers to the edge of the substrate.

10 Claims, 3 Drawing Sheets

RADIO FREQUENCY ANTENNA AND MIXER ARRAY

BACKGROUND OF THE INVENTION

This invention relates to a radio frequency antenna and mixer system composed of a plurality of antennae and associated mixers, especially suitable for fabrication on a substrate utilizing semiconductor fabrication techniques.

Imaging systems are designed for detecting or "viewing" a scene and then reproducing it on some type of display device. For example, existing imaging systems include radar systems, infrared night vision scopes, and the like.

Typically, such systems have operated at electromagnetic frequencies outside of the millimeter-wave portion of the spectrum, i.e., not using electromagnetic energy having a wavelength of between ten millimeters and one millimeter, for frequencies of between 30 GHz and 300 GHz. Problems with lower frequency imaging systems, such as microwave radar systems, include lack of resolution. Problems with higher frequency imaging systems, such as infrared night vision scopes, include the difficulty of signals in this frequency range penetrating most fog, smoke, haze, rain, etc., and therefore the inability to produce a clear image under such circumstances.

It has been recognized that the use of millimeter-wave imaging systems, if they could be constructed in a compact, lightweight, inexpensive fashion, would provide a number of advantages including the ability of signals in this frequency range being able to penetrate poor atmospheric conditions, while also providing high image resolution. One problem in implementing compact, lightweight, inexpensive millimeter-wave imaging systems has been the lack of technologies and component parts which could operate effectively at millimeter-wave signal frequencies.

An example of one such component part or subsystem is an antenna and mixer array for intercepting radio frequency signals and processing the same for ultimate reproduction of the image represented by the signals. In particular, reflected or naturally emitted radio frequency signals from a target object would be detected by an array of receivers, including an array of antennae, the frequency of the received signals would be down-converted to an intermediate frequency, and then such intermediate frequency signals would be processed, using digital signal processing techniques to form an image of the target. Little, if anything, has been done to provide an antenna and mixer array in a fully solid state configuration, for operating in the millimeter-wave range.

It is an object of the invention to provide a radio frequency antenna and mixer array for receiving a plurality of radio frequency signals and for developing intermediate signals therefrom, using circuitry capable of operating in the millimeter-wave range of the electromagnetic signal spectrum.

It is another object of the invention to provide such an array which may be readily fabricated on a semiconductor substrate using semiconductor fabrication techniques.

It is also an object of the invention to provide such an array which is compact, lightweight and relatively inexpensive.

It is a further object of the invention to provide such an array in which inter-component electrical signal interference is minimized, and which allows for separate outputs for each antenna/mixer combination.

SUMMARY OF THE INVENTION

The above and other objects of the invention are realized in a specific illustrative embodiment of a radio frequency antenna and mixer system for receiving and down-converting millimeter-wave r-f signals to i-f signals, where the system includes a base having a generally planar upper surface and a lower surface, and formed of a material having low conductivity, with a layer of conductive materials disposed below the upper surface to act as a ground plane (return for signals being carried by circuitry on upper surface of the base). The layer includes a plurality of spaced-apart low conductivity sections or windows to allow passage therethrough of r-f signals received at the surface of the base. A plurality of antennae are each disposed in a collinear arrangement on the upper surface of the base, over a respective one of the sections or windows in the layer, and a plurality of mixers are each disposed on the upper surface of the base, adjacent a respective antenna for receiving r-f signals therefrom and for producing i-f signals. A plurality of conductors are each disposed on the upper surface of the base and are coupled to a respective mixer to extend therefrom alongside the antenna from which said respective mixer receives r-f signals. The conductors are for carrying i-f signals from the respective mixer to another circuit for utilization.

In accordance with another aspect of the invention, each of said mixers includes a mixer circuit for heterodyning a r-f signal received from a respective antenna, with a local oscillator (l-o) signal, to produce an i-f signal which is supplied to a respective conductor. Each mixer also includes another conductor disposed on the upper surface of the base to extend to the mixer circuit from a direction generally away from the direction in which the i-f signal carrying conductor extends from the mixer circuit. This other conductor provides l-o signals from a local oscillator source to the mixer circuit.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
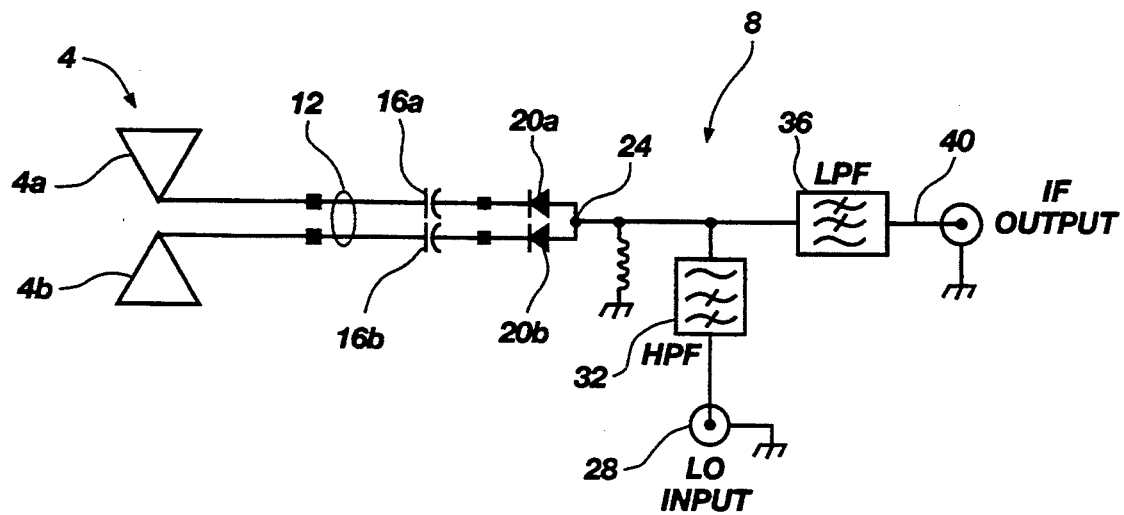
FIG. 1 is a schematic of a single antenna/mixer unit which could be utilized in an antenna/mixer array, made in accordance with the principles of the present invention.
Figure 2:
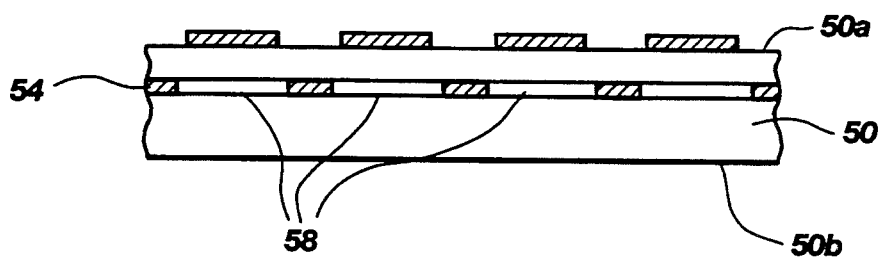
FIG. 2 is a side, fragmented, cross-sectional view of a substrate showing selected components of an antenna/mixer array made in accordance with the present invention.
Figure 3:
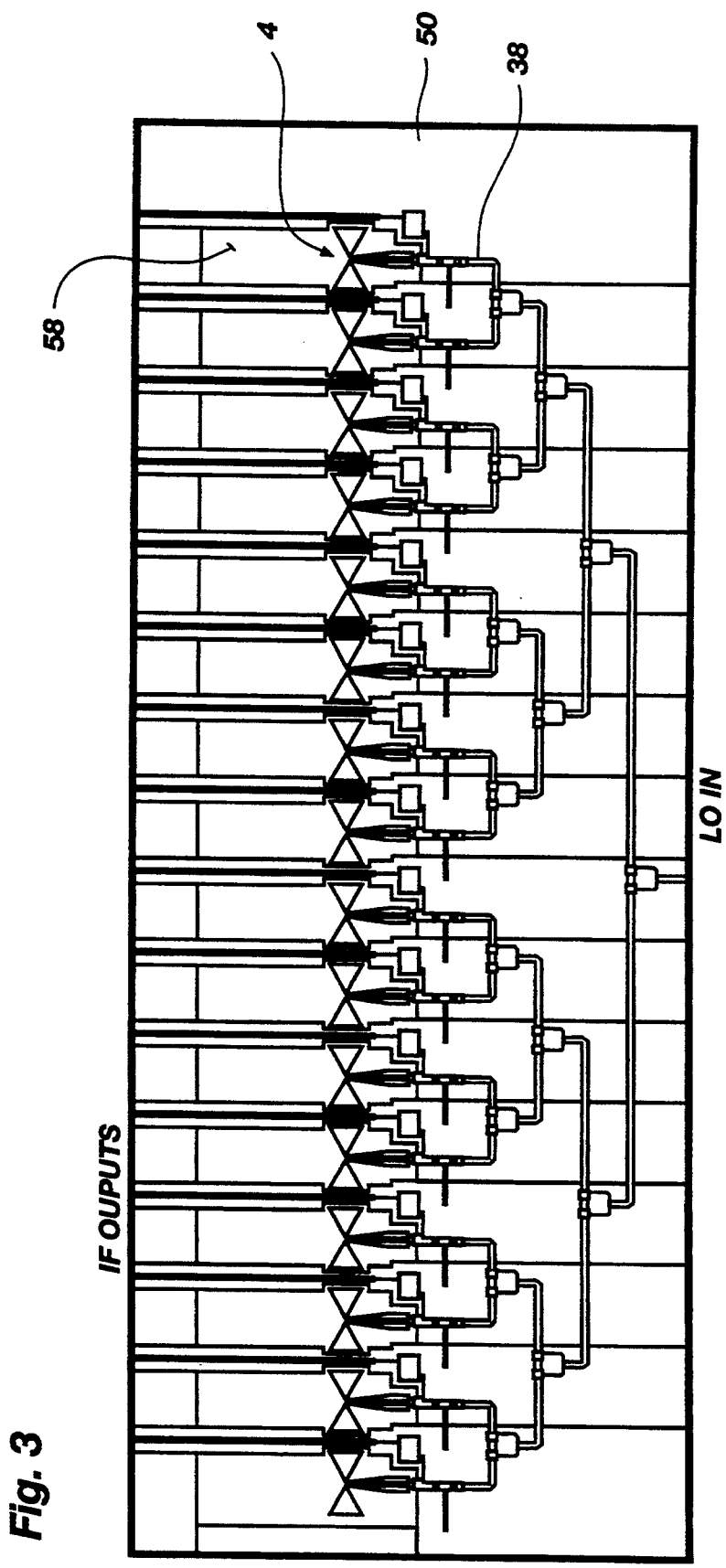
FIG. 3 is a top plan view representation of a radio frequency antenna and mixer array as it might be formed on a semiconductor substrate, in accordance with the present invention.
Figure 4:
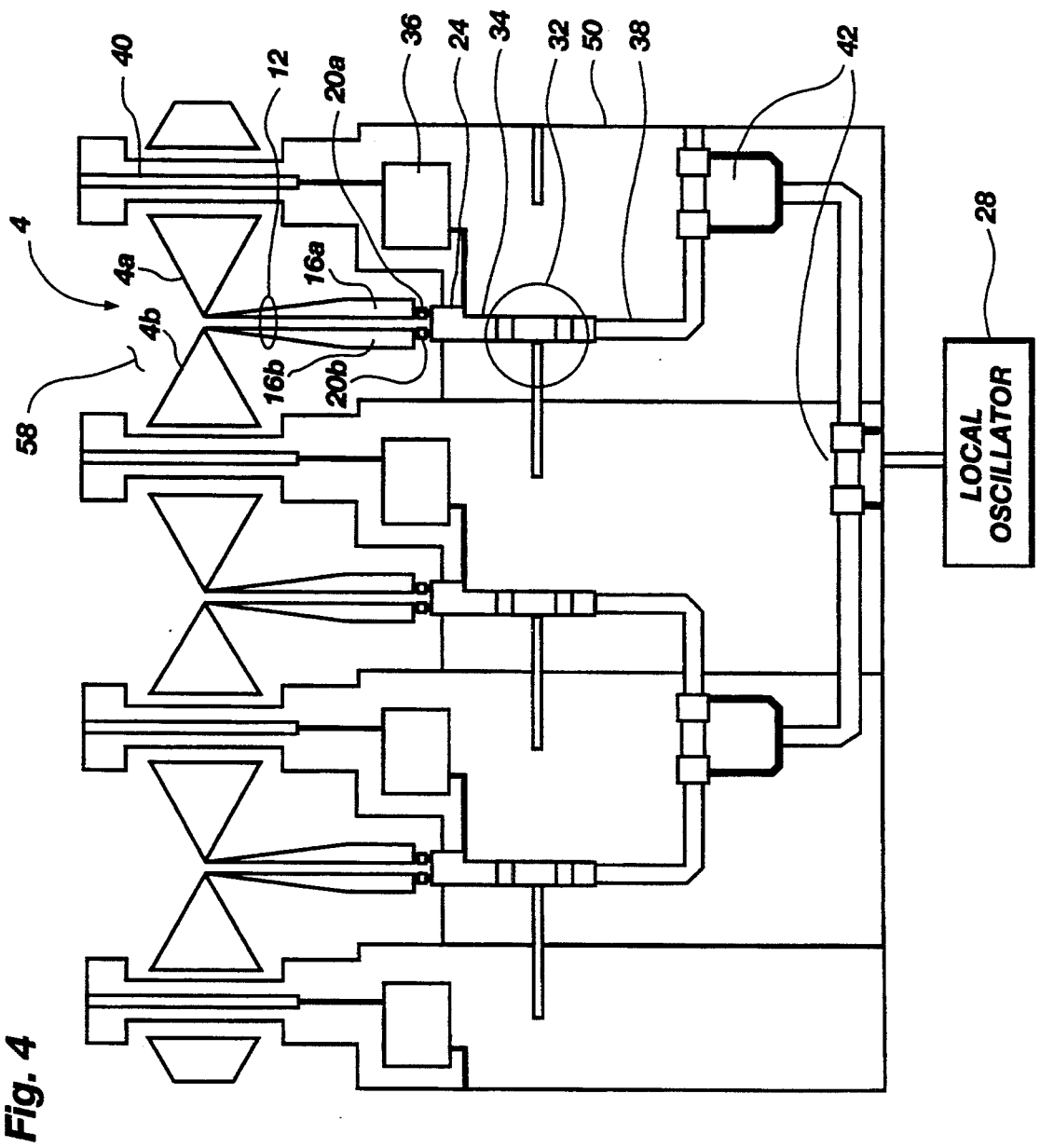
FIG. 4 is an enlarged view of several antenna/mixer combinations of the array of FIG. 3.

Referring to FIG. 1 there is shown a combination radio frequency antenna 4 and mixer 8 suitable for use in an array of antennae/mixers fabricated on a semiconductor substrate such as shown in FIGS. 2, 3 and 4. The antenna 4 is a so-called half-wave 60 degree "bow-tie" dipole antenna, having two halves 4a and 4b. The antenna, of course, is for receiving and coupling incident radio frequency signals into the mixer 8. As the incident radio frequency energy impinges on the antenna 4, the two halves 4a and 4b are alternately oppositely polarized in a well-known manner.

The antenna 4 is coupled by a two conductor balanced line 12, via capacitors 16a and 16b (each disposed in a different one of the conductors of the balanced line 12) to a pair of semiconductor diodes 20a and 20b. The diodes 20a and 20b serve as the non-linear elements of the mixer 8 and might illustratively be Schottky-barrier diodes. The cathode of diode 20a is coupled to the capacitor 16a, and the anode thereof is coupled to the cathode of diode 20b to form a junction or node 24. The anode of diode 20b is coupled to capacitor 16b. The received radio frequency signals drive the conductors of the balanced line 20 alternately to opposite polarities to thereby alternately switch the diodes 20a and 20b.

Coupled between the node 24 and a local oscillator (l-o) input source 28 is a high pass filter 32. The local oscillator input source 28 provides a local oscillator signal to the mixer 8 where it is heterodyned with the received radio frequency signal, at the node or junction 24. Such heterodyning is well-known for down-converting the frequency of a received radio frequency signal to a lower intermediate frequency. A receiver which performs this function is known as a super heterodyne receiver. The intermediate frequency signal thus developed is supplied via a low pass filter 36 to an intermediate frequency output line 40.

The capacitors 16a and 16b act as high pass filters to prevent local oscillator and intermediate frequency signals from reaching the antenna 4. The high pass filter 32 allows local oscillator signals to pass therethrough to drive the diodes 20a and 20b, but prevents intermediate frequency signals from reaching the local oscillator input signal source 28. Similarly, the low pass filter 36 filters out and prevents local oscillator signals and radio frequency signals from reaching the intermediate frequency output line 40, while, of course, allowing intermediate frequency signals to reach the output line.

An array of antennae/mixers of the type shown in FIG. 1 are shown in FIGS. 2-4, formed on a planar structure, in particular a semiconductor substrate 50. Utilizing a planar structure facilitates fabrication using semiconductor fabrication techniques which, it is well-known, are relatively inexpensive and allow for constructing compact circuitry. To allow for processing signals in the millimeter-wave portion of the spectrum, the substrate 50 advantageously is made of gallium arsenide.

The component parts of the antenna/mixer array are formed on an upper surface 50a of the substrate (FIG. 2), with a conductive ground plane 54 formed just below the surface 50a, to provide ground return for signals being carried by the components on the surface. If the substrate 50 is made of gallium arsenide, which is a dielectric, the ground plane 54 could be formed of a layer of doped gallium arsenide. Formed in the ground plane 54 is an array of non-conductive sections or "windows" 58, the function of which will be described momentarily. The windows 58 could simply be undoped areas in the ground plane 54.

FIG. 3 shows a top plan view of a sixteen element antenna/mixer array formed with solid state components upon the substrate 50. Each of the antenna/mixer elements are constructed in accordance with the FIG. 1 configuration. FIG. 4 is a magnified view of a portion of the antenna/mixer array of FIG. 3, and will be used to identify the component parts of an antenna/mixer element. Each such element includes a planar half-wave 60 degree "bow-tie" dipole antenna 4 disposed on the surface of the substrate 50, over a dielectric window 58 (shown as white in FIGS. 3 and 4). The shaded area of the substrate 50 represents the ground plane 54 located below the surface of the substrate. Each of the antennae is located over a corresponding dielectric window so that radio frequency signals received at the surface 50b (FIG. 2) may pass through the dielectric substrate 50 and through the windows 58 to impinge upon the antennae. Otherwise, conductive material such as the ground plane 54, if positioned between a radio frequency source and an antenna, would interfere with and intercept the radio frequency signals so that it would not reach the antenna or would be significantly attenuated upon reaching the antenna.

The antennae are disposed on the substrate 50 in a collinear arrangement, i.e., the antennae are aligned along a linear locus as best seen in FIG. 3. Such a configuration results in significantly less coupling between the antennae and thus less interference between the receipt and processing of radio frequency signals. Of course, radio frequency signals could be received at the upper surface of the substrate 50 by the antenna 4.

The antenna half elements 4a and 4b (FIG. 4) are coupled by respective conductors of a balanced line 12 to capacitors 16a and 16b respectively. The capacitors 16a and 16b, in turn, are coupled respectively to diodes 20a and 20b. The diodes 20a and 20b are coupled to a node or junction 24 which is coupled to a high pass filter 32 by an unbalanced line 34, and also coupled to a low pass filter 36. The high pass filter 32 is coupled by conductors 38 and Wilkinson dividers 42 ultimately to a local oscillator source 28 (FIG. 4). A Wilkinson divider is a well-known conductor branching component. The low pass filter 36 is coupled to an output line 40 which extends between adjacent antennae to exit the substrate. It will be noted that the output line 40 extends from the mixer in a direction opposite that in which the local oscillator conductor 38 extends. This configuration minimizes interference between the local oscillator signals and the intermediate frequency signals, and obviates the need for extending conductors or transmission lines through the substrate. The configuration of the collinear arrangement of the antennae and extending the intermediate frequency output lines between the antennae serves to minimize coupling between the antennae and the intermediate frequency output line.

The width of the conductors of the balanced line 12 and the spacing therebetween are selected to minimize the impedance discontinuity encountered by radio frequency signal energy passing from the antenna to the mixer. Typically, the width of these conductors is in the millimeter range, e.g., 5 to 20 mm, and the gap spacing therebetween is less than the width, all depending on the wave length.

With the antenna/mixer array configuration described above, a compact, lightweight and cost effective antenna/mixer system is provided for receiving and processing millimeter-wave radio frequency signals. The array may be fabricated using semiconductor fabrication techniques, and intercomponent coupling and interference is minimized. The dielectric windows 58 serve to focus the radio frequency energy into the array and in particular onto the antennae which are positioned over the windows.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

We claim:

1. A radio frequency antenna and mixer system for receiving and down-converting r-f signals to i-f signals, said system comprising
   a base having a generally planar upper surface and a lower surface, and formed of a material having low conductivity, with a ground-plane layer of conductive material disposed below said upper surface, said layer including a plurality of spaced-apart low conductivity sections,
   a plurality of antenna means, each antenna means being disposed on the upper surface of the base, over a respective one of the low conductivity sections in said layer,
   a plurality of mixer means, each disposed on the upper surface of the base, adjacent a respective antenna means for receiving r-f signals therefrom and for producing i-f signals,
   a plurality of means for inputting a local oscillator signal to each of a respective mixer means, and
   a plurality of output conductors, each output conductor disposed on the upper surface of the base, each of the output conductors being coupled to a respective mixer means, the respective output conductor extending therefrom alongside the antenna means in a direction generally away from the means for inputting a local oscillator signal, the output conductor extending alongside the antenna means from which said respective mixer means receives r-f signals and each of the output conductors carrying i-f signals from said respective mixer means.

2. A system as in claim 1 wherein each of said mixer means includes
   a mixer circuit for heterodyning a r-f signal received from a respective antenna means with a local oscillator (l-o) signal to produce an i-f signal which is supplied to a respective output conductor, and wherein the means for providing a local oscillator signal comprises an l-o conductor disposed on the upper surface of the base, the l-o conductor extending to the mixer circuit in a direction generally away from the direction in which the respective first conductor extends from the mixer circuit.

3. A system as in claim 2 wherein said low conductivity material comprises gallium arsenide, and wherein said layer of conductive material comprises a layer of doped gallium arsenide.

4. A system as in claim 2 wherein each mixer circuit further comprises
   a low pass filter means coupled between the junction of the diodes, and a corresponding output conductor to filter out and prevent l-o and r-f signals from reaching said corresponding output conductor, and
   a first high pass filter means coupled between the junction of the diodes and a corresponding l-o conductor to filter out and prevent i-f signals from reaching said corresponding l-o conductor.

5. A system as in claim 4 where each mixer circuit further comprises a second high pass filter means coupled between the pair of diodes and the corresponding balanced line to filter out and prevent l-o and i-f signals from reaching the corresponding antenna.

6. A system as in claim 1 wherein said antenna means are arranged generally in row, in a collinear relationship, on the base.

7. A system as in claim 6 wherein said antenna means each comprises a half wave bow-tie dipole antenna, having first and second half elements.

8. A system as in claim 7 further comprising a plurality of balanced lines disposed on the base, each coupled between a respective antenna and a respective mixer circuit for carrying r-f signals from the respective antenna to the respective mixer circuit, and wherein said second conductors each comprise an unbalanced line.

9. A system as in claim 8 wherein each balanced line comprises first and second conductors disposed side by side on the upper surface of the base, the first conductor being coupled to the first half element of the corresponding antenna, and the second conductor being coupled to the second half element of such antenna, and wherein each mixer circuit comprises a pair of semiconductor diodes disposed on the upper surface of the base, the cathode of one of the diodes being coupled to the first conductor of a corresponding balanced line, and the anode thereof being coupled to the cathode of the other diode to form a junction therebetween, the anode of said other diode being coupled to the second conductor of the corresponding balanced line.

10. A system as in claim 9 wherein the first and second conductors of each balanced line are generally parallel with one another, having a gap width less than the width of the conductors.

* * * * *